(12) United States Patent
Kaefer et al.

(10) Patent No.: US 9,363,931 B2
(45) Date of Patent: Jun. 7, 2016

(54) CARRIER FOR A DISPLAY MODULE AND DISPLAY APPARATUS HAVING SUCH A CARRIER

(75) Inventors: Stefan Kaefer, Stuttgart (DE); Volker Burkhardt, Ehningen (DE)

(73) Assignee: Robert Bosch GmbH, Stuttgart (DE)

( * ) Notice: Subject to any disclaimer, the term of this patent is extended or adjusted under 35 U.S.C. 154(b) by 171 days.

(21) Appl. No.: 14/233,004

(22) PCT Filed: May 22, 2012

(86) PCT No.: PCT/EP2012/059422
§ 371 (c)(1),
(2), (4) Date: Jun. 4, 2014

(87) PCT Pub. No.: WO2013/010695
PCT Pub. Date: Jan. 24, 2013

(65) Prior Publication Data
US 2014/0321054 A1 Oct. 30, 2014

(30) Foreign Application Priority Data
Jul. 15, 2011 (DE) .......................... 10 2011 079 216

(51) Int. Cl.
*H05K 7/20* (2006.01)
*G02F 1/1333* (2006.01)
*H05K 5/02* (2006.01)

(52) U.S. Cl.
CPC ...... *H05K 7/20954* (2013.01); *G02F 1/133385* (2013.01); *H05K 5/0213* (2013.01); *H05K 7/20127* (2013.01); *H05K 7/20972* (2013.01); *G02F 2001/133314* (2013.01)

(58) Field of Classification Search
CPC ...................... H05K 7/20954–7/20972; H05K 7/20127–7/20145; H05K 5/0213
See application file for complete search history.

(56) References Cited

U.S. PATENT DOCUMENTS

| 8,693,185 | B2 * | 4/2014 | Dunn | G02F 1/133385 165/80.3 |
|---|---|---|---|---|
| 2004/0100769 | A1 | 5/2004 | Chung et al. | |
| 2005/0047067 | A1 * | 3/2005 | Bang | H05K 7/20963 361/679.21 |
| 2009/0147175 | A1 * | 6/2009 | Tsumura | H05K 7/20963 349/58 |
| 2012/0026432 | A1 * | 2/2012 | Dunn | G02F 1/133385 349/69 |
| 2012/0281161 | A1 * | 11/2012 | Hubbard | G02F 1/133308 349/58 |

FOREIGN PATENT DOCUMENTS

| CN | 201754323 U | 3/2011 |
|---|---|---|
| JP | 2003 173147 | 6/2003 |

* cited by examiner

*Primary Examiner* — Gregory Thompson
(74) *Attorney, Agent, or Firm* — Norton Rose Fulbright US LLP

(57) ABSTRACT

A carrier for a display module, in particular for an LED display module, having an arrangement for accommodating and/or fastening a display module, and having an air inlet opening and at least one air outlet opening, connected to one another by air ducts through which cooling air can flow to cool the display module, the carrier having a central air inlet opening that is connected via air ducts to at least two air outlet openings situated at different locations of the carrier, and the air ducts being fashioned between ribs provided on the carrier. Also described is a display device having such a carrier, and a display module carried thereby.

13 Claims, 3 Drawing Sheets

CARRIER FOR A DISPLAY MODULE AND DISPLAY APPARATUS HAVING SUCH A CARRIER

FIELD OF THE INVENTION

The present invention relates to a carrier for a display module. The carrier has an arrangement for accommodating and/or fastening a display module, as well as an air inlet opening and at least one air outlet opening. These two openings are connected to one another by air ducts through which cooling air can flow in order to cool the display module. In addition, the present invention relates to a display device that includes such a carrier and a display module carried by it.

BACKGROUND INFORMATION

Carriers of this type are used in particular for LED display modules, which can be realized for example as LED backlight displays. LEDs (Light-Emitting Diodes) have a long useful life, a small constructive size, and a high degree of efficiency in the conversion of electrical energy into light. In addition, LEDs are distinguished by a lack of sensitivity to impacts and vibrations, which is a significant advantage in particular for applications in motor vehicles.

Nonetheless, against the background of constant progress in increasing efficiency, and the associated high power drain in LEDs, heat loss has to be dissipated in order to prevent overheating and thus functional impairment or even destruction of the LEDs. The display panels of the display modules are also sensitive to heat. Through the action of heat, their display characteristic can change, and their useful life can be shortened.

In order to dissipate the heat loss that occurs during operation of display modules, various designs are known. Standardly, the lost heat from LED elements is dissipated to a metallic cooling element. Thus, in display modules it is known to dissipate the heat arising at the LEDs directly via the display housing. The display housing, usually made of steel or aluminum plate, here acts as a heat sink.

It is also believed to be understood to dissipate the heat to external cooling elements via so-called heat pipes.

Patent document US 2004/0100769 A1 discusses a cooling device for light valves. Light valves, which can be used for example as an electrically controllable diffraction grating for producing images in projectors and monitors, are here fastened on a side of a circuit board by a carrier frame. On the other side of the circuit board there is provided a cooling device having a base plate from which a projection extends, through an opening in the circuit board, up to the light valve in order to absorb its heat loss. On the rear side of the base plate of the cooling device, there is provided a large number of cooling ribs situated parallel to one another, surrounding a ventilator. The ventilator produces an air stream that flows past the cooling ribs in order to dissipate the heat.

A carrier for a display module of the type named above is discussed in JP-2003173147 A. Here, a display module is accommodated in a housing that to this extent acts as a carrier. The housing has an air inlet opening and an air outlet opening via which an airflow can be directed through the housing in order to cool the display and to dissipate heat. Here, the airflow in the housing is guided through an air duct that is fashioned between a circuit board and reinforcing ribs provided on the rear side of the display module.

DISCLOSURE OF THE INVENTION

An object of the present invention is to propose a carrier for a display module that, with a simple design, enables an efficient and uniform cooling even of larger display modules. Moreover, a display device having a display module is to be created that is distinguished by a long useful life.

The object may be achieved by a carrier for display module as described herein. In addition, the object is achieved by a display device having the features described herein.

The basic idea of the present invention is that the carrier has a central air inlet opening and at least two air outlet openings that are situated at different locations of the carrier, the air inlet opening being connected to the air outlet openings via air ducts that are fashioned between ribs provided on the carrier.

The essential basic idea of the present invention is that an air stream supplied through an inlet opening is divided and distributed among a plurality of outlet openings. In this way, even large-surface display modules can be cooled uniformly and particularly effectively. Because only a single air stream has to be fed through a central air inlet opening, the cooling can in addition be achieved at lower cost than in the case of a supply of cooling air over a large surface.

Also, no additional parts, such as heat pipes, are required for the heat dissipation, so that the outlay and costs are low.

Overall, in a constructively particularly simple manner a highly efficient cooling is achieved of a display module that is to be used in the carrier according to the present invention.

Moreover, the central supply of air enables a reduction of the required constructive space, which in particular in the automotive field is a further substantial advantage.

It is particularly advantageous if the central air inlet opening is connected via air ducts to a large number of air outlet openings that are situated on the upper side of the carrier and at least on the two sides of the carrier situated opposite one another. In addition, further air outlet openings can also be provided on the lower side of the carrier. In this way, a particularly good distribution of the cooling air can be achieved over the surface of the display that is to be accommodated.

At least individual air outlet openings may be situated on the carrier in such a way that an air stream flowing through an air outlet opening flows in a plane that is oriented parallel to the display module that is to be accommodated. In this way, deflections of the air stream in the region of the outlet openings are avoided, which permits a constructive shape that is advantageous with respect to flow, with low losses and low-noise operation.

In addition, it is particularly advantageous if only a single central air inlet opening is provided that is situated centrally in a lower region of the carrier.

Advantageously, the air inlet opening here has a rectangular opening cross-section.

It is advantageous if the air inlet opening is situated on the carrier in such a way that the air stream that is supplied flows through it perpendicular to the plane of a display module that is to be accommodated.

According to a particular specific embodiment, the ribs between which the air ducts for the cooling air are formed run at least approximately radially relative to a central point of the air inlet opening. In this way, the cooling air ducts extend outward in the manner of a fan from the point of an air inlet, enabling a particularly uniform distribution of the cooling air from the central air inlet over the entire surface of a display module that is to be accommodated.

Moreover, a radial configuration of cooling ribs significantly increases the rigidity of the carrier, and thus also the stability of a display device equipped therewith, which has a positive effect on the so-called mura formation (optical errors or image errors on the display, above all image errors due to a non-uniformly distributed liquid crystal layer in the display panel, also referred to in English as mura phenomena). In particular in IPS (In-Plane Switching) displays, which are increasingly used due to their high image quality, torsion or twisting of the display results in a so-called black mura formation on the display, i.e. disturbing bright cloudy regions in dark images. Such image disturbances can be effectively reduced by a more rigid construction of the carrier, which is a further advantage of the radial configuration of the ribs.

It is particularly advantageous if the ribs are situated on the front side of the carrier, facing the display module that is to be accommodated, so that the cooling air can flow immediately along the rear side of a display module. If, in addition thereto, cooling ribs running at least approximately perpendicularly are provided on the rear side of the carrier, facing away from the display module that is to be accommodated, then a forced convection can be brought about that causes an additional cooling of the carrier. If this cooling via the forced convection is sufficient given a lower thermal load, for example a lower ambient temperature and/or a display that is for example dimmed at night, then the active cooling caused by a ventilator can be throttled or even switched off. Possible disturbing noises due to the ventilator, and the power consumption of the ventilator, can be minimized in this way.

The carrier may be made of a light metal alloy, in particular a magnesium alloy. Due to its low specific mass, in this way the overall weight of a display device equipped with the carrier according to the present invention can be kept particularly low. Moreover, magnesium has good thermal conductivity and good electrical conductivity, which has a positive effect on the cooling and on the electromagnetic compatibility (EMC properties) of the display device.

Errors in the image representation of the display, in particular mura formations, can in addition be prevented or reduced through cutting machining, which may be milling, of the support surfaces of the carrier that come into contact with the display module that is to be accommodated. In this way, very precise and flat surfaces can be achieved having a high surface quality, reducing possible warpage of the display module when it is screwed onto the carrier, and simultaneously permitting a low thermal transition resistance between the display and the carrier, and thus a good heat dissipation.

The present invention further relates to a display device, in particular a display device for a motor vehicle, having a carrier of the type described above having a display module carried thereby. Due to the efficient and uniform cooling of the display module achieved through the design of the carrier, functional impairments or destruction of the panel and of the light sources, in particular of the LEDs of the display module due to overheating, are avoided or at least reduced, so that the useful life of the display device is increased.

The display module may be fastened to the carrier by screws, substantially increasing the overall rigidity of the display device and thus having a positive effect on the image quality, or possible mura formation of the display.

Advantageously, the carrier and the rear wall of the display module situated thereon are made of the same material, or at least a very similar material, thus preventing mechanical tensions between the components due to different rates of thermal expansion, which also has a noticeable positive effect on the image quality.

It is particularly advantageous if a circuit board, which may be a flexible circuit board (FPC=Flexible Printed Circuit), via which the electrical signals are transmitted to the display panel, is fixed on the rear side of the display module, in particular is glued thereon. In this way, mechanical stresses of the circuit board or of the FPC, caused for example by tensile loading, and thus also mechanical loading of the display panel and resulting image impairments due for example to mura formation, can be avoided. At the same time, the fixing prevents the FPC from changing its position and thus from preventing the circulation of cooling air in the display device.

In order to create sufficient space for the circuit board or for the FPC, the rear side of the display module and/or the ribs facing the display module can be recessed in the region of the circuit board or of the FPC. Damage to the circuit board due to contact with the ribs of the bearer can in this way be avoided.

In the following, the present invention is explained in more detail through examples, on the basis of the accompanying drawings.

DETAILED DESCRIPTION

Figure 1:
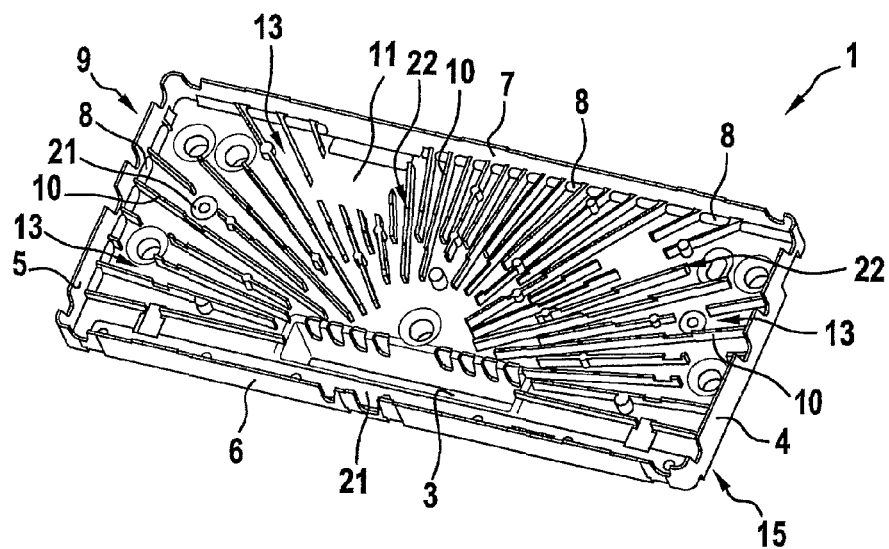
FIG. 1 shows a three-dimensional view of a carrier according to the present invention.
Figure 2:
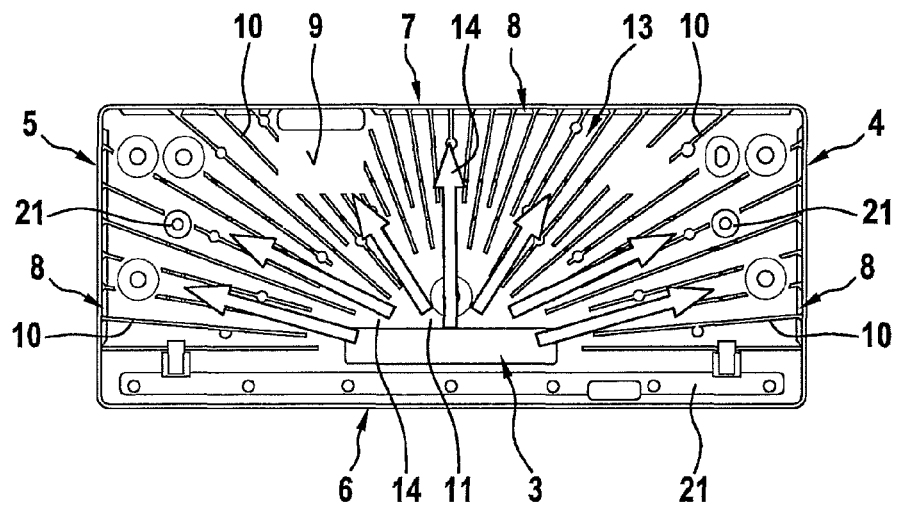
FIG. 2 shows a front view of the carrier of FIG. 1.
Figure 3:
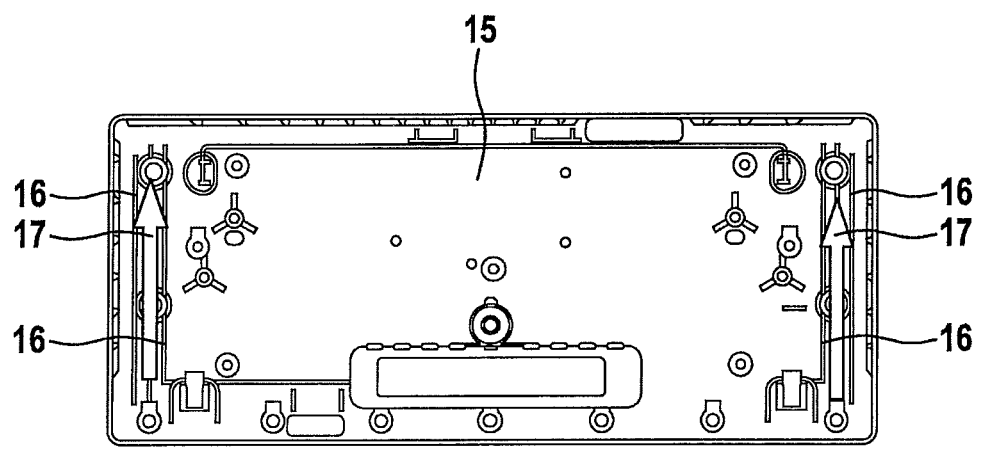
FIG. 3 shows a rear view of the carrier of FIG. 1.
Figure 5:
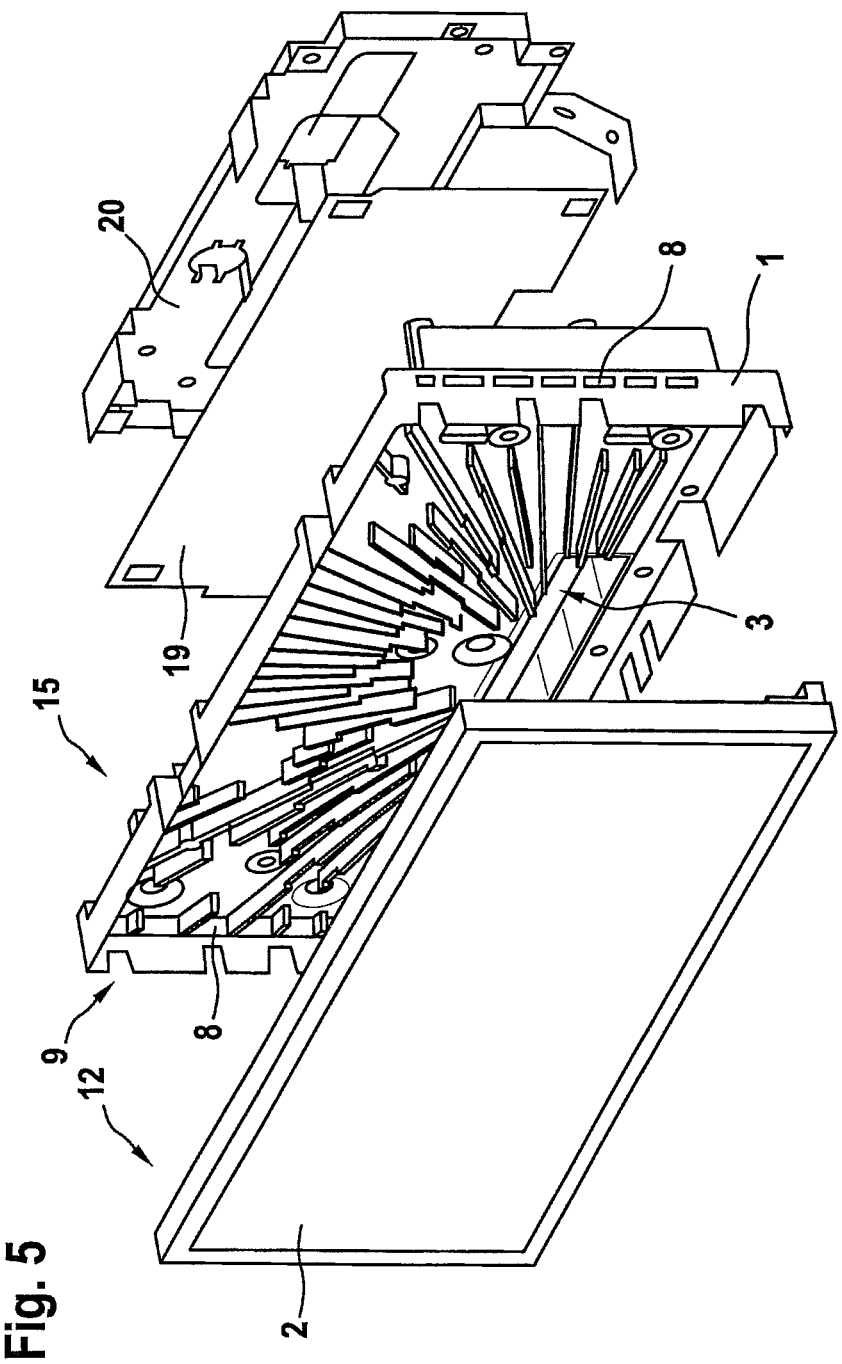
FIG. 5 shows an exploded view of the display device of FIG. 4.

FIGS. 1 through 3 show an example of a carrier 1 according to the present invention in which a display module 2 shown in FIG. 5 can be accommodated. Carrier 1 has only a single central air inlet opening 3, here situated, with a rectangular cross-section, centrally between right side 4 and left side 5, and close to lower side 6, of carrier 1. Here, air inlet opening 3 is situated in the main plane of extension of carrier 1, which is situated parallel to the plane of the drawing in FIGS. 2 and 3, so that an air stream flowing through air inlet opening 3 runs perpendicular to the plane of display module 2 that is to be accommodated.

On upper side 7, and at right and left sides 4, 5, of carrier 1, there is situated a multiplicity of air outlet openings 8 through which, in various positions of carrier 1, a part of the air stream admitted through opening 3 flows, in each case in a plane parallel to display module 2 that is to be accommodated.

For this purpose, a plurality of cooling ribs 10 are formed on a front side 9, facing display module 2 that is to be accommodated, of carrier 1, the ribs extending radially outward going out from a central point of air inlet opening 3. Cooling ribs 10, made in one piece with carrier 1, form between themselves, and between base surface 11 of carrier 1 and rear wall 12 of display module 2 that is to be accommodated, a plurality of air ducts 13 through each of which a part of the supplied air stream flows, as is symbolized by arrows 14 in FIG. 2. Here, air ducts 13 cover, in a fan-shaped configuration, the entire surface of display module 2 that is to be accommodated, permitting a particularly uniform and effective cooling of display module 2.

In addition, some cooling ribs 16, situated parallel to one another and running perpendicular, are provided on rear side 15, facing away from display module 2 that is to be accommodated, of carrier 1, additionally causing a passive cooling of carrier 1 through forced convection, as symbolized in FIG. 3 by arrows 17.

Figure 4:
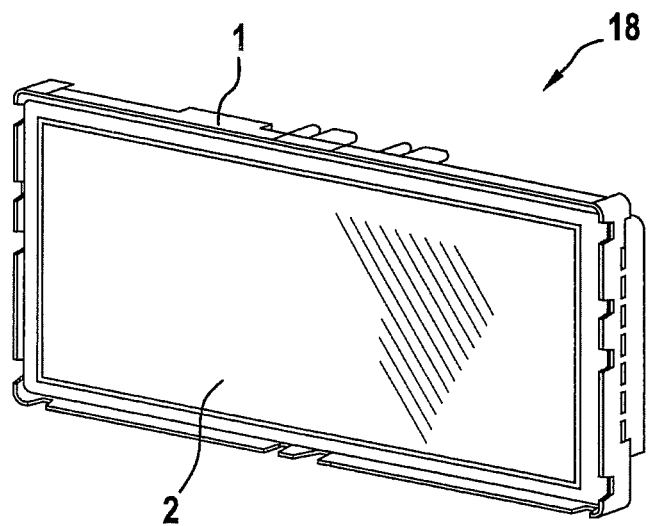
FIG. 4 shows a three-dimensional view of a display device according to the present invention.

In FIG. 4, a display device 18 intended for use in a motor vehicle is shown in which a display module 2, here realized with LED backlighting, is accommodated in carrier 1. As is shown in FIG. 5, display device 18 moreover includes a circuit board 19 situated on rear side 15 of carrier 1 and covered by a rear cover 20.

Display module 2 is fastened on carrier 1 by screws, and support surfaces 21 of carrier 1, which come into contact with display module 2, are milled in order to achieve a high surface quality in order to reduce as far as possible, or completely prevent, errors in the image representation, in particular mura formations.

On rear wall 12 of display module 2, in a strip-shaped upper region a flexible circuit board (FPC) (not shown in more detail) is glued on that is electrically connected to circuit board 18, and via which the signals for image production are transmitted to the panel of display module 2. In order to prevent damage to the flexible circuit board by cooling ribs 10, these ribs are made with small recesses 22 in the region of the flexible circuit board.

What is claimed is:

1. A carrier for a display module, comprising:
   a carrier arrangement that is configured to at least one of accommodate and fasten a display module, and that includes:
   (a) a central air inlet opening;
   (b) at least two air outlet openings situated at different locations of the carrier arrangement;
   (c) air ducts (1) through which cooling air can flow to cool the display module and (2) that connect the central air inlet opening to the at least two air outlet openings; and
   (d) ribs between which the air ducts are configured and that are arranged at least approximately radially about a central point at the central air inlet opening, so that the cooling ducts extend outwardly from the air inlet opening in the configuration of a fan.

2. The carrier of claim 1, wherein the at least two air outlet openings are situated on a first side of the carrier arrangement and on two other sides of the carrier arrangement, the two other sides being situated on opposite sides of the first side.

3. The carrier of claim 1, wherein the at least two air outlet openings are situated on the carrier arrangement so that an air stream flowing through the at least two air outlet openings flows in a plane that is oriented parallel to the display module that is to be accommodated.

4. The carrier of claim 1, wherein the central air inlet opening is situated centrally in a lower region of the carrier arrangement, the central air inlet opening having a rectangular opening cross-section.

5. The carrier of claim 4, wherein the central air inlet opening is situated on the carrier arrangement so that air flow through it is perpendicular to the plane of the display module that is to be accommodated.

6. A carrier for a display module, comprising:
   a carrier arrangement that is configured to at least one of accommodate and fasten a display module, and that includes:
   (a) a central air inlet opening;
   (b) at least two air outlet openings situated at different locations of the carrier arrangement;
   (c) air ducts (1) through which cooling air can flow to cool the display module and (2) that connect the central air inlet opening to the at least two air outlet openings;
   (d) first ribs between which the air ducts are configured and that are situated on a front side of the carrier arrangement, facing the display module when the display module is at least one of accommodated and fastened by the carrier arrangement; and
   (e) second ribs, wherein the second ribs are cooling ribs that run in a direction that is at least approximately parallel to at least one exterior edge of the carrier arrangement and that are situated on a rear side of the carrier arrangement, facing away from the display module accommodated and fastened by the carrier arrangement.

7. The carrier of claim 1, wherein the carrier arrangement is made of a light metal alloy, which includes a magnesium alloy.

8. The carrier of claim 1, wherein support surfaces that come into contact with the display module that is to be at least one of accommodated and fastened are processed by cutting, machining, or milling.

9. A display device, comprising:
   a display module; and
   a carrier arrangement that carries the display module and that includes:
   (a) a central air inlet opening;
   (b) at least two air outlet openings situated at different locations of the carrier arrangement;
   (c) air ducts (1) through which cooling air can flow to cool the display module and (2) that connect the central air inlet opening to the at least two air outlet openings; and
   (d) ribs between which the air ducts are configured and that are arranged at least approximately radially about a central point at the central air inlet opening, so that the cooling ducts extend outwardly from the air inlet opening in the configuration of a fan;
   wherein the display module is fastened to the carrier by screws.

10. The display device of claim 9, wherein a flexible circuit board is glued or otherwise fixed on a rear side of the display module.

11. A display device comprising:
    a display module;
    a flexible circuit board glued or otherwise fixed on a rear side of the display module; and
    a carrier arrangement that carries the display module and that includes:
    (a) a central air inlet opening;
    (b) at least two air outlet openings situated at different locations of the carrier arrangement;
    (c) air ducts (1) through which cooling air can flow to cool the display module and (2) that connect the central air inlet opening to the at least two air outlet openings; and
    (d) ribs between which the air ducts are configured;
    wherein:
    the display module is fastened to the carrier by screws; and
    at least one of:
    the rear side of the display module is recessed in a region of the circuit board; and
    the ribs face the display module and are recessed in a region of the circuit board.

12. The display device of claim 10, wherein the display device is for a motor vehicle.

13. The carrier of claim 1, wherein the carrier is for an LED display module.

* * * * *